(12) United States Patent
Moginine Gummer et al.

(10) Patent No.: US 6,329,817 B1
(45) Date of Patent: Dec. 11, 2001

(54) ELECTRONIC SENSOR APPARATUS

(75) Inventors: Robert Hugh Moginine Gummer; Matthew Edwin Laws, both of Greenlane; Brett Gordon McGill, Titrangi, all of (NZ)

(73) Assignee: Group 3 Technology Limited, Auckland (NZ)

( * ) Notice: Subject to any disclaimer, the term of this patent is extended or adjusted under 35 U.S.C. 154(b) by 0 days.

(21) Appl. No.: 09/385,741

(22) Filed: Aug. 30, 1999

(30) Foreign Application Priority Data

Aug. 31, 1998 (NZ) ........................................ 331607

(51) Int. Cl.⁷ ..................... G01R 33/06; G01R 35/00; G01R 33/07
(52) U.S. Cl. ...................... 324/251; 324/225; 327/511
(58) Field of Search ..................... 324/225, 202, 324/207.12, 207.2, 251; 702/104, 85, 86; 330/32 H; 327/510, 511

(56) References Cited

U.S. PATENT DOCUMENTS

| | | |
|---|---|---|
| 4,074,186 * | 2/1978 | Flaherty ............................. 324/225 |
| 4,109,527 | 8/1978 | Goode, Jr. . |
| 4,272,760 | 6/1981 | Prazak et al. . |
| 4,437,164 | 3/1984 | Branch, III . |
| 4,873,655 | 10/1989 | Kondraske . |
| 5,012,411 | 4/1991 | Policastro et al. . |
| 5,329,818 | 7/1994 | Frick et al. . |

OTHER PUBLICATIONS

Maxim Integrated Products et al. "0.1%—Accurate Signal Conditioner for Piezoresistive Sensor Compensation," Feb. 1998, pp. 1–10.

* cited by examiner

Primary Examiner—Walter E. Snow
(74) Attorney, Agent, or Firm—Greer, Burns & Crain, Ltd.

(57) ABSTRACT

A sensor for measuring a parameter includes at least one transducer adapted to provide an analog transducer signal, and at least one converter adapted to convert the analog transducer signal into a digitized transducer signal, and a memory device associated with the converter capable of receiving the digitized transducer signal directly from the converter. The memory device is configured to provide a digitized output value from a memory location, the memory location being associated with or corresponding to the digitized transducer signal received by the memory device.

18 Claims, 4 Drawing Sheets

FIG. 1
PRIOR ART
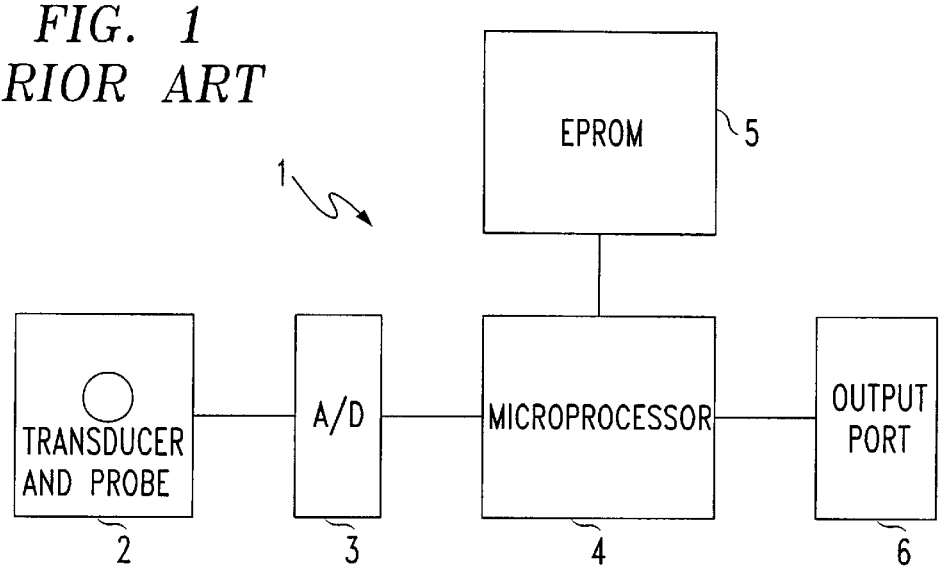
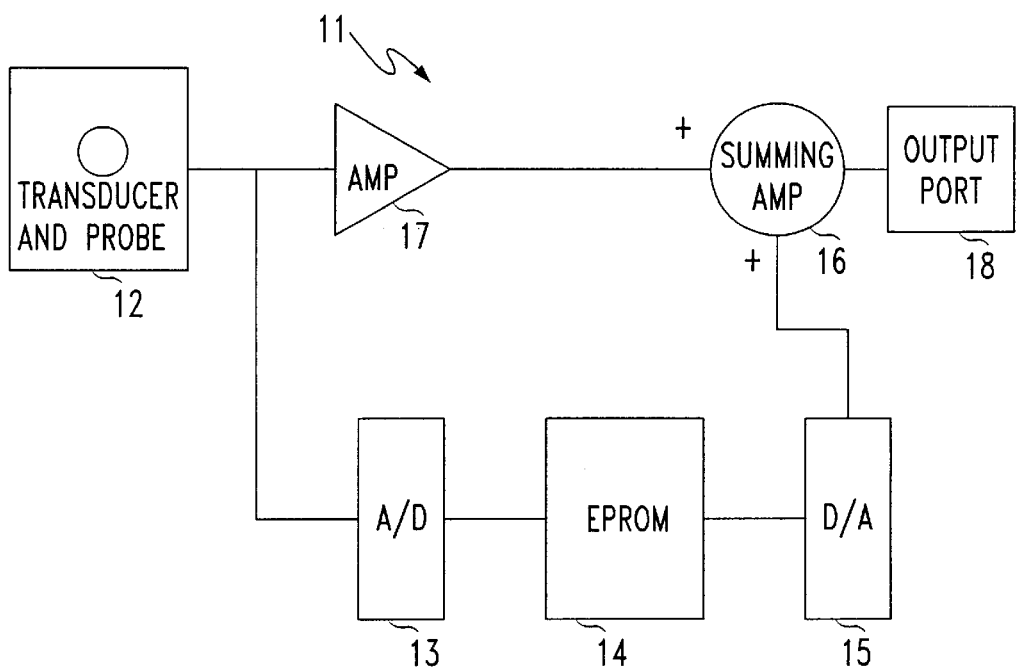
FIG. 2

ELECTRONIC SENSOR APPARATUS

TECHNICAL FIELD

This invention relates to improvements in sensors that provide or use electrical componentry. Specifically the present invention may be used, and will be described throughout this specification as being used within a magnetic field sensor. However it should be appreciated by those skilled in the art that the present invention has numerous applications outside of magnetic field sensors and reference to the above throughout this specification should in no way be seen as limiting.

BACKGROUND ART

Numerous modern electrical devices rely on sensors to provide information about an environment. These sensors can be electrically driven and in most cases consist of some form of transducer which provides an output signal which can be measured. The output signal measured will vary depending on the value of the parameter that is sensed by the sensor. As the sensed parameter changes, so will the sensed output of the transducer. However, a large number of transducers provide output signals that are not directly or linearly proportional to the parameter sensed. For example, in some instances the transducer output may increase exponentially with a linear increase in the sensed parameter, making it difficult to obtain a quick and clear indication of the sensed parameters value. Usually some form of microprocessor or computer is required to provide a scaling function that allows a final linear output to be displayed by the sensor.

Use of a microprocessor in a sensor creates problems if the sensor is to be used in a particularly harsh environment. For example, if the sensor is to be used in an environment where there is a lot of electrical noise, or where it is possible that high voltages may accidentally be applied to the microprocessor, it is likely that the microprocessor will tend to fail or crash frequently. This can be a large problem as the sensor will fail to work correctly or accurately if the microprocessor is continually malfunctioning.

In some transducers, environmental factors such as, for example, ambient temperature, humidity or pressure may also have an effect on the transducer's measured output. In these cases, environmental conditions may change instead of the parameter measured, prompting a change in the transducer's output and hence possibly creating errors in the sensor output. In such situations, environmental conditions also need to be monitored and accounted for when the final result of the transducer is displayed. This is usually done by providing an additional transducer for each environmental condition of concern and imputing a signal from each transducer to the microprocessor used. Provision for these components further complicates the design and manufacture of such sensors.

In most instances, known sensors as discussed above may include a transducer to measure the parameter of interest and a transducer for each environmental condition which has an effect on the output of the first transducer. The output from each transducer is fed through an analog to digital converter and then into a microprocessor which analyzes the signals obtained and takes into account any errors which may be caused by environmental conditions. The microprocessor will then output a digital signal that is linearly proportional to the parameter measured.

In some instances the microprocessor may also be connected to a memory device such as an EPROM which allows information to be stored and supplied to the microprocessor if required. These memory devices are usually configured to contain the machine language instructions (i.e., the program) which is to be executed by the processor. The EPROM is configured to provide these instructions to the processor every time the processor is powered up.

This approach is relatively costly as a separate transducer and an analog to digital converter is required for each environmental condition monitored and also for the parameter measured. This can greatly increase the size and complexity of sensing probes used to place the transducers used in a region of interest. In addition, if the sensors' output is to be sampled at high speed or frequencies, comparatively expensive and fast electrical componentry will also need to be used in the implementation of the sensor.

Recently, sensor users have also found applications for sensors that provide an analog instead of digitized electrical output. In existing devices this could only be obtained if an additional digital to analog converter was placed at the output of the sensor. However this approach again increases the cost of the sensor and further reduces the speed at which the sensors' output can be updated.

An improved sensor that could be implemented with limited and inexpensive components would be of greater advantage over the prior art. An improved sensor that only required one transducer yet still took account of environmental conditions affecting the transducers operation would also be of great advantage over the prior art. It is an object of the present invention to address the foregoing problems or at least to provide the public with a useful choice.

Further aspects and advantages of the present invention will become apparent from the ensuing description which is given by way of example only.

DISCLOSURE OF INVENTION

According to one aspect of the present invention there is provided a sensor for measuring a parameter, said sensor including at least one transducer adapted to provide an analog transducer signal, and at least one converter adapted to convert said analog transducer signal into a digitized transducer signal, and a memory device associated with the converter capable of receiving said digitized transducer signal directly from said converter, the sensor characterized in that the memory device is configured to provide a digitized output value from a memory location, said memory location being associated with or corresponding to the digitized transducer signal received by the memory device.

According to a further aspect of the present invention there is provided a sensor substantially as described above, wherein the sensor also includes a digital to analog converter associated with the memory device and adapted to receive said digitized output value and convert same into an analog output value.

According to yet another aspect of the present invention there is provided a sensor substantially as described above, wherein the sensor also includes a summation device adapted to receive said analog output value from the digital to analog converter and add same to the original analog transducer signal provided by the transducer, wherein the summation device provides a summed output signal which has a substantially linear relationship to the parameter measured by the sensor.

According to a further aspect of the present invention there is provided a method of operating a sensor substantially as described above, said method of operation characterized by the steps of:

i) providing an analog transducer signal to a converter from a transducer, and ii) converting said analog transducer signal to a digitized transducer signal, and iii) supplying said digitized transducer signal directly to the input of a memory device, and iv) matching said digitized transducer signal to a memory location in the memory device, and v) transmitting a digitized output value stored within said matched memory location to a digital to an analog converter, and vi) converting said digitized output value to an analog output value.

According to yet another aspect of the present invention, there is provided a method of operating a sensor substantially as described above, being further characterized by the additional step of adding said analog output value to the original analog transducer signal to provide a summed output signal which has a substantially linear relationship to the parameter measured by the sensor.

A sensor as discussed throughout this specification may be used to measure a particular parameter or value associated with an object or a region. For example, in some embodiments the sensor may be configured to measure magnetic field strength, electric field strength, temperature, mass, density, or any other number of parameters which can be measured using known types of transducers. The present invention may be employed to simplify and improve the design and operation of sensors that include transducers configured to measure a particular parameter, value or effect.

In a preferred embodiment, the present invention may be adapted and configured to measure magnetic field strength using a Hall effect transducer. However, it should be appreciated by those skilled in the art that the present invention may be used to measure any number of different types of parameters or effects other than magnetic field strength and reference to use of the invention in this application should in no way be seen as limiting.

In a preferred embodiment, an analog transducer signal provided by the transducer may be an electrical signal transmitted along or through an electrical conductor.

With analog signals, an electrical characteristic of the signal may provide information with regard to the parameter sensed by the transducer via for example, the voltage, current or frequency of the signal, depending on the particular transducer used.

In a further preferred embodiment, an analog transducer signal may convey information with regard to the measured parameter in the voltage level only of the signal. In such embodiment, if the voltage of the analog transducer signal is measured, this voltage can be used to determine the approximate value of the parameter measured.

For example, if the parameter to be measured is magnetic field strength and a Hall effect transducer is used, an analog transducer signal provided by the transducer may be the Hall voltage generated by the Hall effect transducer. This voltage of the analog transducer signal then gives an indication as to the strength of the magnetic field in the region of the transducer.

Reference throughout this specification shall now be made to analog transducer signals provided by a transducer as conveying information through the voltage level of the signal. However, it should be appreciated by those skilled in the art that other electrical characteristics of a signal may be considered for an analog transducer signal, and reference to the above only throughout the specification should in no way be seen as limiting.

In a preferred embodiment, a converter may be any type of electrical device or arrangement of electrical devices which is capable of converting an analog voltage signal into a digitized information signal, where the digitized signal produced represents a value for the magnitude of the analog transducer signal voltage at the time at which it was converted. Those skilled in the art should appreciate that any type of analog to digital converter (ADC) well known in the art can be used as a converter, with selection of the ADC depending on the particular transducer used, and the design and performance requirements of the sensor.

In a preferred embodiment, a digitized transducer signal produced by a converter may provide a digitized signal that represents a value or number, said value or number indicating the voltage of the analog transducer signal at the time of conversion. This digitized transducer signal may then be used to provide information to a memory device in an appropriate digitized format. In most instances, modern electrical memory devices are configured only to receive electrical signals in digitized format and hence conversion from an analog transducer signal to a digitized transducer signal will normally be required. In a preferred embodiment, the memory device may consist of an erasable programmable read only memory (EPROM).

EPROMS are well known in the art, are relatively inexpensive and may be used to store digitized numbers or values in particular "addressed" memory locations. Those skilled in the art will appreciate that a memory location may be addressed by being associated with or by corresponding to a particular digitized value which may be received throughout an input to the EPROM. In this way, a digitized input signal may be applied to the EPROM which will then indicate that the contents of a memory location associated with or corresponding to that input signal should then be output from the EPROM. Such an EPROM can be thought of as a large table, where input signals present on a table's axis can be matched to a corresponding memory location.

Reference throughout this specification will now be made to the memory device as being an EPROM. However, it should be appreciated by those skilled in the art that other forms of memory device may be used in conjunction with the present invention and reference to the above only throughout this specification should in no way be seen as limiting.

For example, other electrical memory devices such as EEPROM, or E2PROM, Flash EEPROM or OTP PROM devices may be used as memory devices in other alternative embodiments.

Preferably, the output from the ADC discussed above may be applied directly from the ADC to an input of the EPROM or other memory device used in the construction of the present invention. This eliminates the need for a microprocessor or any other similar device to process the digitized signal produced by the ADC into a form acceptable by the EPROM. The value supplied from the ADC may simply be used as an addressing input to the memory device.

In one possible but alternative embodiment, the digitized output value obtained from the EPROM may provide the final result or information to be displayed or output by the sensor. The digitized output value obtained from the EPROM may be calculated so that this value has a substantially linear relationship to the parameter measured by the sensor. The EPROM may be used to store "pre-calculated" digitized output values which would normally have to be calculated in real time by the microprocessor used in existing prior art devices. In this way the digitized output value may be output from the sensor to provide the output of the sensor with a linear relationship with respect to the measured parameter.

In this alternative embodiment the digitized output values stored by the EPROM may indicate the approximate value of the magnetic field for a particular analog transducer signal, substantially reducing the cost and complexity of the sensor when compared with existing similar technology.

In a preferred embodiment however, the digitized output value from an EPROM may be transferred or transmitted to a digitized to analog converter. Those skilled in the art will appreciate that these types of devices are relatively common and may be used to convert a digitized information signal or value to an analog voltage signal. Any type of known digital to analog converter (DAC) may be used in the construction of the present invention, with selection of this device or components being dependent on the particular operational and performance requirements of the resulting sensor. Such a DAC may be configured to provide an analog output value represented by a voltage level placed on an electrically conducting line.

In one possible alternative embodiment, this analog output value may be the final output from the sensor, and the voltage level of the signal may be directly or linearly proportional to the magnetic field sensed by the sensor. In such an embodiment, this analog signal may be fed or supplied to other electrical devices that rely on an accurate indication of the magnetic field strength in a particular region.

In a preferred embodiment however, the analog output value produced by the DAC may be supplied to a summation device.

In a further preferred embodiment, such a summation device may consist of or include any type of amplifier that is configured to add the analog output value from the DAC to the original transducer signal obtained from the transducer. However, in alternative embodiments a summation device may not be formed from or incorporate an amplifier. For example in one alternative embodiment a passive resistor network may be used to form the summation device.

In such a preferred embodiment, the resulting summed output signal may be calculated to end up being a particular value such that when the DAC output is added to the original transducer signal, the resulting summed output signal will have a substantially linear relationship to the parameter measured by the sensor. In such an embodiment, if for example magnetic field strength is measured, if the magnetic field strength increases exponentially, then the summed output signal will also increase exponentially. Conversely, if the magnetic field strength measured increases at a fixed rate, then the summed output signal will also increase at the same fixed rate. In this way, the summed output signal may be said to have a substantially linear relationship to the parameter measured by the sensor.

By using a summation element to add a correction signal to the original transducer signal, the sensor may still retain the facility to continuously provide an output value for the basic uncorrected transducer signal. This means that the transducer signal will still be available to an output of the sensor at all times, so that if the output of the sensor is sampled at a higher rate than which the corrected value is added to the summation device, information from the transducer used may still be available.

In such an embodiment, the memory device may only store values to be added or summed with an original transducer signal as corrections only. By storing correction values instead of the actual output information required, a substantial decrease in the amount of information which needs to be stored by the memory device is obtained for the same accuracy or resolution of the final signal.

The digitized value stored within each memory location may be predetermined by calibration procedures run on the sensor before it is supplied to its ultimate user. These calibration procedures may apply fixed and known environmental conditions and values of the parameter to be measured to the transducer to determine what the digitized output value should be for a particular measurement of analog transducer signal. Further, computer driven interpolation programs may also be used to limit the number of physical data points which need to be measured by physically testing procedures.

By pre-calculating the value of each memory location, the operational speed of the sensor can be substantially increased. As there is no need for a microprocessor or other computational device to be incorporated within the sensor to calculate the value required for each memory location, the speed of the resulting sensor will only be limited by the operational speed of the memory device, the DAC or ADC's used.

It should be appreciated by those skilled in the art that particular components and elements discussed above need not be limited to the actual specific description of components discussed above. Those skilled in the art should appreciate that any number and type of electrical devices may be used to provide the memory device, analog to digital converter, digital to analog converter, or the summation device or devices discussed above. Reference to specific components should in no way be seen as limiting.

For example, in one alternative embodiment the entire sensor may be implemented using a single integrated circuit, with each particular component discussed being constructed as an internal module or element in the one chip. Alternatively, multiple integrated circuits or even analog electrical components may be used if required in the construction of the present invention. The invention as discussed above provides many advantages over existing similar types of sensors.

The present invention eliminates the requirement for a microprocessor to be included into the sensor. This allows the sensor to be used in environments where high electrical noise or voltage transients could cause serious problems for the operation of a microprocessor.

The use of a memory device such as an EPROM instead of a microprocessor allows the sensor to be operated at a high speed. As all possible results to be produced by microprocessor have been "pre-calculated" and stored in the memory device, delays associated with the operation of the microprocessor and its calculations are eliminated. In operation, the present invention need only receive an address or address signals in the form of a digitized transducer signal and match these signals to a particular memory location to provide the required result for the sensor's eventual output or display.

The present invention, configured as discussed above also substantially decreases the costs associated with constructing such a sensor. With the present invention, there is no need for expensive high-speed componentry if the sensor is to be run at high speeds and its output sampled at high frequency. Relatively low cost video components may be used in this particular application if required. Furthermore, the above design eliminates the need or requirement for a microprocessor and hence also the cost associated with designing and embedding software into such a microprocessor.

According to yet another aspect of the present invention, there is provided a sensor for measuring a parameter, said sensor including at least one transducer adapted to provide a first analog transducer signal and a second analog transducer signal, and at least two converters, with a first converter being adapted to convert the first analog transducer signal into a first digitized transducer signal, and a second converter adapted to convert said second analog transducer signal to a second digitized transducer signal, and a memory device associated with said converters capable of receiving said first and second digitized transducer signals directly from said converters, wherein the sensor is characterized in that the memory device is configured to provide a digitized output value from a memory location, said memory location being associated or corresponding to both the first digitized transducer signal and the second transducer signal received by the memory device.

According to yet another aspect of the present invention, there is provided a method of operating a sensor substantially as described above, said method of operation characterized by the steps of:

a) providing a first analog transducer signal to a first converter from a transducer, and b) providing a second analog transducer signal to a second converter from said transducer, and c) converting said first analog transducer signal to a first digitized transducer signal, and d) converting said second analog transducer signal to a second digitized transducer signal, and e) supplying said first and second digitized transducer signals directly to an input or inputs of a memory device, and f) matching a memory location in the memory device to both the first digitized transducer signal and the second digitized transducer signal, and g) transmitting a digitized output value stored within said matched memory location to a digital to analog converter, and h) converting said digitized output value to an analog output value.

In a further preferred embodiment, two analog transducer signals may be obtained from a single transducer. In such an embodiment only a single probe containing a single transducer may be required, and different analog transducer signals may be obtained by measuring different electrical characteristics of the transducer.

Preferably only a first and a second analog transducer signal is obtained in the operation of the present invention. However, it should be appreciated by those skilled in the art that any number of analog transducer signals may be obtained from a transducer and processed using a similar methodology to that discussed above, depending on the particular transducer and also the environment in which the transducer is placed.

In a further preferred embodiment, the present invention may be adapted to receive two analog signals from a Hall effect transducer. In such an embodiment the first analog signal sampled or measured may be the Hall voltage developed across the device through the application of a constant current to the transducer, and by a magnetic field in the vicinity of the transducer. The Hall voltage produced across the transducer will be approximately $$VH=k(B \times Ic)$$

where k depends on many parameters, including the temperature of the Hall device. A second analog signal may also be obtained from the same transducer by measuring the voltage drop through the transducer, or resistive voltage, when a constant current source is connected to same. This resistive voltage VR is approximately equal to $$VR=I \times R$$

where again R will vary as a function of temperature as well as magnetic field strength. Reference throughout this specification shall now be made to the present invention as being configured to use two analog transducer signals only. However, it should be appreciated by those skilled in the art that any number of analog transducer signals may be used in conjunction with the present invention and reference to the above only throughout this specification should in no way be seen as limiting.

A measurement of two or more analog transducer signals may be used to remove the effect of errors in the sensor's output or display caused by environmental conditions. Some environmental conditions are of concern as they may also have an effect on the appropriate measured electrical characteristics of the transducer. For example, in one embodiment where the magnetic field strength is measured, the temperature of the transducer will also have an effect on the first analog transducer signal obtained from the transducer. This can be a problem where an environmental condition such as temperature changes, which can result in errors in the sensors output or display.

In such an embodiment, each analog transducer signal provided may be a function of both the measured parameter and also an environmental condition. By considering two separate signals together, these signals may be thought of as providing two simultaneous equations, both of which involve two variables. These two "equations" may then be solved to provide values for both the measured parameter and also the environmental condition affecting the transducer.

Both these two signals may be "solved" by a microprocessor in a calibration procedure and the resulting correct value for the measured parameter stored in a particular memory location of the memory device. During operation of the sensor, all that is required is for the digitized transducer signals obtained to be supplied to the memory device to indicate which memory location contains the correct output value for the parameter measured.

For example, in the example given above with respect to a Hall effect transducer, the first voltage measured Vh is a function applied to temperature and magnetic field strength B. The second voltage measured VR varies depending on the resistance of the transducer which in turn varies dependent on the temperature of the transducer and the magnetic field strength in the vicinity.

In such an embodiment, both first and second analog transducer signals obtained may be converted into first and second digitized transducer signals in parallel in substantially the same manner discussed above. The first and second digitized transducer signals obtained in this manner may then be supplied to different inputs of the memory device and used to identify a particular memory location.

In such an embodiment, the memory locations of the memory device may have a two-part address which must be matched with both the first and the second digitized transducer signals. In this way, a two dimensional array or table of correct values may be provided in the memory device as what is known as a look-up table. Such an array or table can be thought of as having a number of columns and a number of rows. The correct memory value location for a particular pair of transducer signals can be selected by the first transducer signal indicating the correct column, and a second transducer signal indicating the correct row at which the appropriate correction value is stored within the table.

When the two transducer signals are received, they will then indicate a match with one particular memory location which will contain a particular digitized output value as discussed above. In this way, both the first and second analog transducer signals obtained will influence which digitized output value is supplied by the memory device.

Preferably, the present invention includes two separate analog to digital converters to convert each analog transducer signal obtained and to supply the converted digitized signals directly to inputs to the memory device. This configuration of the invention eliminates the need for any type of microprocessor or other computational device within the sensor. This substantially reduces the cost associated with manufacturing the present invention, providing a sensor which is far more robust with respect to adverse environmental conditions and places few limitations on the speed at which the digital devices used can be clocked. If a microprocessor were used and the output of the invention was to be sampled at a high frequency, a relatively expensive microprocessor would be required.

Those skilled in the art should appreciate that the effects of a number of environmental conditions or factors may also be accounted for if the appropriate number of analog transducer signals can also be obtained from the transducer. Further, in some embodiments it may also be advantageous to supply information with regard to the particular environmental condition affecting the operation of the transducer. For example, in one embodiment, the sensor may display information with regard to magnetic field strength in, and the temperature of a particular region.

The present invention provides a number of advantages over existing prior art devices. A single transducer only is required to obtain information with regard to both the measured parameter and also environmental conditions. This eliminates the need to place additional transducers in sensor probes, thereby reducing the cost and complexity of the resulting sensor.

In a further preferred embodiment, the value stored in each memory location may also be calculated to both remove the effect of environmental conditions from the sensor's output, as well as to linearize the sensor output as described previously. In such an embodiment, again as described previously, a summation device may also be provided to sum or add the output from the memory device (converted into analog form) to one of the original analog signals obtained from the transducer. This sum signal will then be corrected for non-lineararities as well as for at least one environmental condition which can have an effect on its values.

Those skilled in the art should appreciate that the techniques and methods described previously with respect to the measurement of a single transducer signal and the linearization of same may also be applied and used in an embodiment where two analog transducer signals are also obtained.

BRIEF DESCRIPTION OF DRAWINGS

Further aspects of the present invention will become apparent from the ensuing description which is given by way of example only and with reference to the accompanying drawings in which:

FIG. 1 illustrates a block diagram of components commonly used in a prior art sensor;

FIG. 2 illustrates the components used in a sensor configured in accordance with one embodiment of the present invention;

BEST MODES FOR CARRYING OUT THE INVENTION

Figure 3:
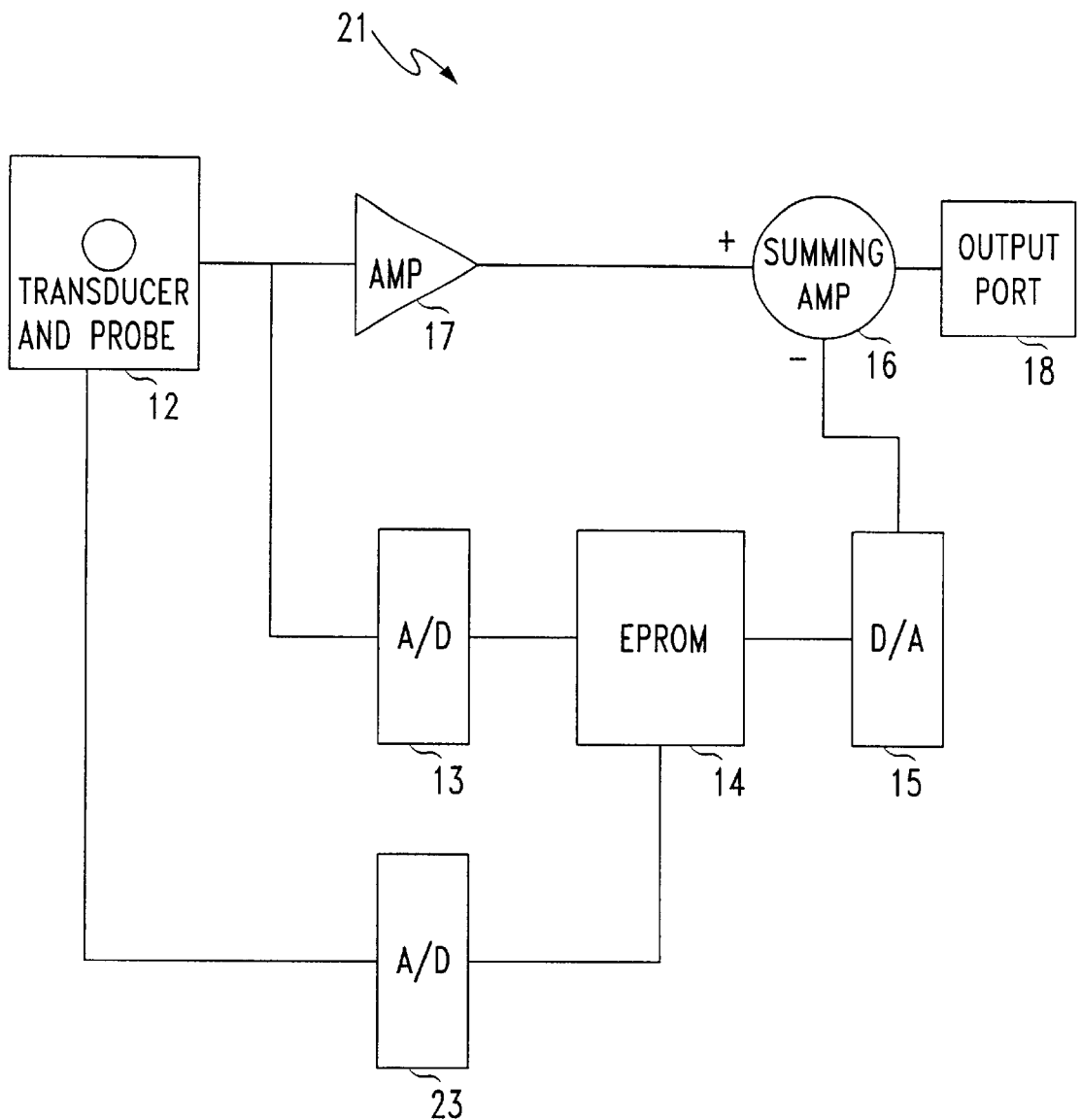
FIG. 3 illustrates the components used in a sensor configured in accordance with another aspect of the present invention.

FIG. 1 shows a prior art configuration of a sensor used to measure a parameter. The sensor 1 includes a transducer and probe 2, an analog to digital converter 3, a microprocessor 4, a memory device, shown in this embodiment as an EPROM 5, and an output port 6.

In operation, an analog transducer signal is generated in the transducer 2 and transmitted to the analog to digital converter (ADC) 3. The ADC then converts this analog signal into a digitized signal with a value dependent on the analog signal's voltage, and transmits same to the microprocessor 4.

With the help of information stored in and supplied from the EPROM 5, the microprocessor 4 processes the digitized information supplied to it to provide a digitized output signal to output port 6, where the value represented by this digitized signal will have a substantially linear relationship to that of the parameter measured by the sensor 1.

As discussed previously, the use of a microprocessor 4 in the sensor's construction places some limitations on the resulting device. Firstly, an expensive microprocessor is required if the results of the sensor are to be sampled at high frequency. In this case, the microprocessor must operate at relatively high speeds to ensure the information it provides is supplied quickly enough. In addition, the use of microprocessors in extremely electrically noisy environments is to be avoided, as high levels of electrical noise and also voltage transients may cause the microprocessor to crash or be damaged, which can severely degrade the performance of the sensor.

FIG. 2 shows a sensor 11 for measuring a parameter configured in accordance with one aspect of the present invention. The sensor 11 includes a transducer and associated probe housing 12 adapted to provide an analog transducer signal. The analog transducer signal produced will be supplied to a converter, shown in this embodiment as an analog to digital converter (ADC) 13. The ADC 13 is adapted to convert the analog transducer signal generated by the transducer 12 into a digitized transducer signal.

The digitized transducer signal generated by the ADC 13 is then supplied to a memory device, shown in this embodiment as an EPROM 14. The EPROM 14 is adapted to receive the digitized transducer signal produced by the ADC 13 and to match same to a particular memory location (not shown) contained within itself. Each memory location within the EPROM 14 is associated with or corresponds to a particular digitized transducer signal value which, when the signal value is received from the ADC will cause the EPROM to output the contents of the particular memory location indicated as a digitized output value. A digitized output value output from the EPROM 14 will then be transmitted to a digital to analog converter (DAC) 15 associated with the EPROM 14. The DAC 15 is adapted to receive the digitized output value and convert same into an analog output value with a voltage proportional to the value represented by the digitized output value.

This analog output value is then transmitted onto a summation device, shown in this embodiment as a summing amplifier 16. However as discussed above, the use of an amplifier as a summation device is optionable and other configurations of summing devices may be used in alternative embodiments. The summing amplifier 16 is adapted to receive the analog output value from the DAC 15 and add same to the original analog transducer signal provided by the transducer 12. The original analog transducer signal is provided from the transducer 12 through an amplifier 17 to ensure that the analog transducer signals voltage level can be easily received and manipulated by the summing amplifier 16.

The summing amplifier 16 is adapted to add these two analog signals together to provide a summed output signal. In some embodiments, the summing amplifier 16 may also apply different weightings or multipliers to each of the inputs it is supplied. This summed output signal is then provided at an output port 18 and will have a substantially linear relationship to the parameter measured by the sensor 11.

FIG. 3 illustrates a sensor 21 configured in accordance with another aspect of the present invention. The sensor 21 is a modified or improved version of the sensor 11 shown in FIG. 2. In addition to the basic sensor shown in FIG. 2, the sensor 21 of FIG. 3 also includes an additional ADC 23. This additional ADC 23 is adapted to receive a second analog transducer signal from the transducer and probe 12, and also to convert same into a second digitized transducer signal to be transmitted to the EPROM 14. As discussed above, a first analog transducer signal may be provided from the transducer 12, forwarded to the ADC 13 and converted to a first digitized transducer signal to be supplied to the EPROM 14.

Both the first and second digitized transducer signals received by the EPROM 14 may be matched to a particular memory location within the EPROM, so that each digitized transducer signal will form part of an "address" for a particular memory location. The particular memory location that matches both the first and second digitized transducer signals will then have its stored digitized output value transferred to the DAC 15.

In this embodiment, the two separate analog transducer signals are used to find an address for a particular memory location. The digitized output value stored within this memory location will be calculated to take into account the effect of any environmental condition which effects the performance of the transducer and hence the two analog transducer signals it provides. As the two signals are created by two different variables, they may be processed and "solved" as simultaneous equations to provide values for both the measured parameter and also the environmental condition involved.

The digitized output value stored within the matched memory location will, when converted to an analog format, and added to the original transducer signal be capable of removing the non-linearity of the original transducer signal and correcting for the effects of an environmental condition.

In this way, a sensor may be constructed to include or require only a single transducer and yet still take into account the effect of an environmental condition on the signals obtained from the transducer.

Figure 4:
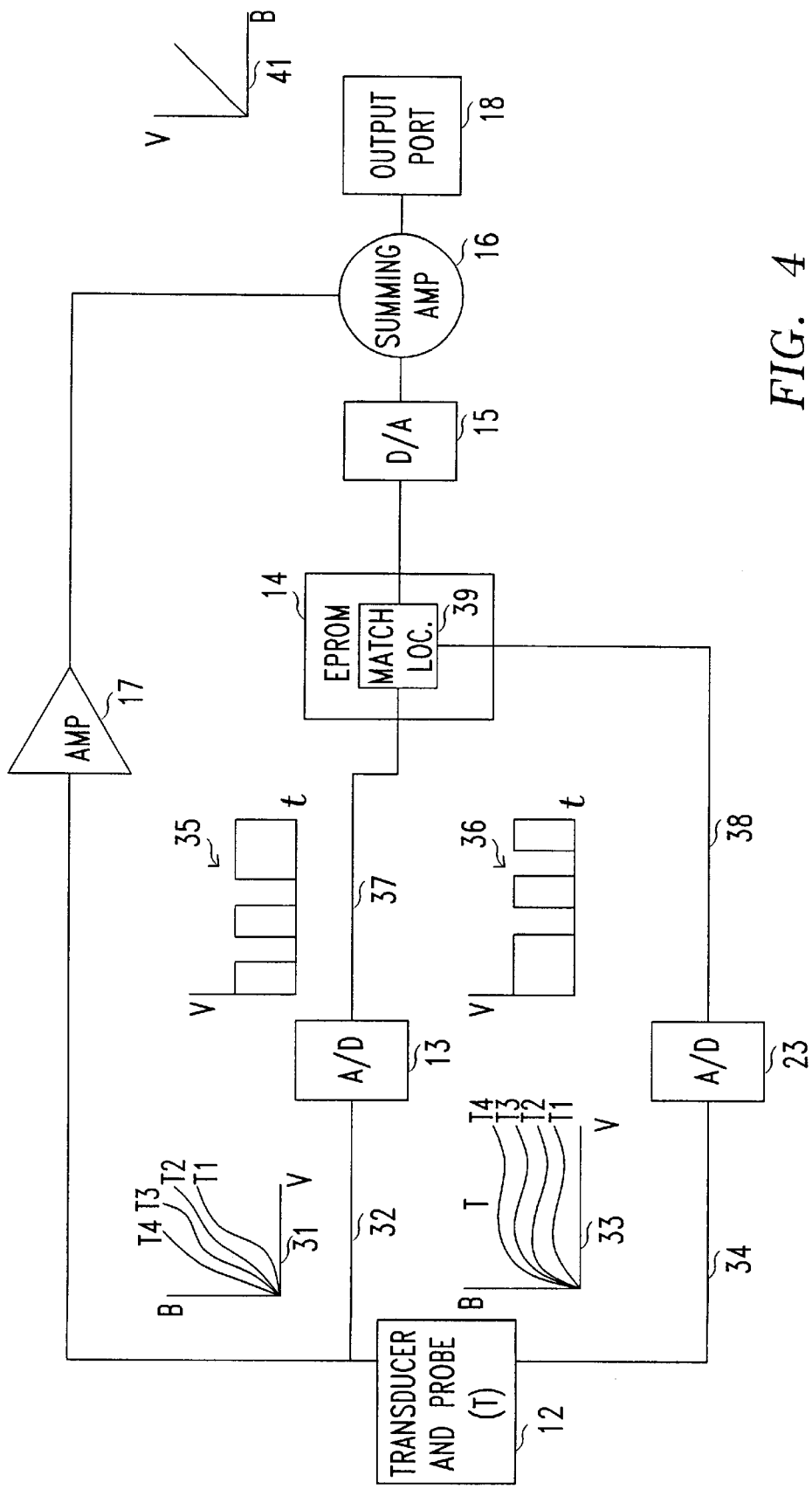
FIG. 4 shows a schematic view of the types of signal obtained from each component of the sensor shown in FIG. 3.

FIG. 4 shows a schematic view of the types of signal obtained from each component of the sensor shown in FIG. 3.

A plot 31 shows the relationship of magnetic field strength B to signal voltage V for a first analog transducer signal on line 32 with temperature T as an environmental condition or parameter which causes variations in the B versus V plots.

Plot 33 shows the relationship between magnetic field strength and signal voltage for the second analog transducer signal present upon line 34 and how this plot varies under the effect of varying temperatures.

Each of these two analog signals are then converted into a digitized format via each of the converters 13,23 with this digitized signal being shown in voltage versus time plots 35,36. The input of the EPROM is then divided into two parts to provide two separate input ports.

The first digitized transducer signal on line 37 is applied to one input port of the EPROM 14 and the second digitized transducer signal placed on line 38 is applied to a second input port of the EPROM 14. The values of these two digitized signals are then used as addresses to find a match for a particular memory location 39 within the EPROM 14. The contents of a matched location 39, known as a digitized output value, is transmitted to a digital to analog converter 15. The DAC 15 then converts the digitized output value to an analog output value, the voltage of which will vary with magnetic field strength B, and with temperature T as an environmental condition or parameter.

This analog output value is transmitted from the DAC 15 to the summing amplifier 16 and added to the original first analog transducer signal which has been amplified by amplifier 17. The combination of these two combined signals is output from output port 18, and the voltage of this signal has a substantially linear relationship to the magnetic field strength in the region of the transducer 12 (shown in plot 41), and is independent of the environmental condition (in this case being temperature).

The digitized output value contained within the matched location 39 is previously calculated so that when it is converted to an analog format and added to the original first analog transducer signal, it will remove any non-linearity from the transducer signal, and also remove any errors in the first transducer signal that may have been caused by environmental conditions instead of the parameter to be measured.

Figure 5:
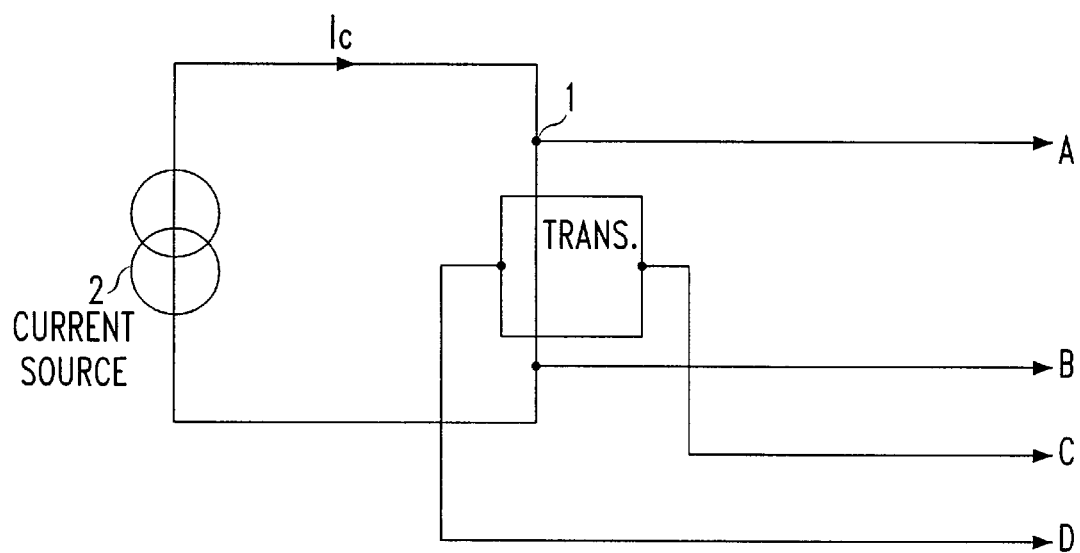
FIG. 5 shows a schematic diagram of how a Hall effect transducer may be incorporated into and used with the present invention and the analog signals which may then be obtained from such a device.

FIG. 5 shows a schematic diagram of a Hall effect transducer configured for use with the present invention. The transducer 1 is connected to a constant current source 2 and is also located in the vicinity of a magnetic field (not graphically represented). Under the action of the constant current Ic applied across the transducer and the magnetic field in the vicinity, a Hall voltage VH (measured across terminals C and D) is generated across transducer 1. VH generated in this manner substantially equal to $$VH=K(B \times Ic)$$

where K is a temperature dependent multiplier. Therefore VH can be seen to be a function of both magnetic field strength and temperature.

The resistive voltage, or the voltage drop experienced across the Hall effect sensor between terminals A and B can also be measured as a second analog signal. The resistive voltage VR can be shown to be equal to $$VR=Ic \times R$$

where R is the resistance of the transducer which varies with both magnetic field strength B and the temperature of the device T. Therefore VR can also be seen to be a function of both magnetic field strength and temperature.

Aspects of the present invention have been described by way of example only and it should be appreciated that modifications and additions may be made thereto without departing from the scope thereof as defined in the appended claims.

What we claim is:

1. A sensor comprising:

one or more transducers adapted to provide a first analog transducer signal and a second analog transducer signal, at least two converters, with a first converter being adapted to convert said first analog transducer signal to a first digital transducer signal, and a second converter adapted to convert said second analog transducer signal to a second digital transducer signal, a memory device associated with said converters capable of receiving said first and second digital transducer signals directly from said converters, and said memory device being configured to provide a digital output value from a memory location, said memory location being associated with or corresponding to both the first digital transducer signal and the second digital transducer signal received by the memory device.

2. The sensor as claimed in claim 1 wherein a single transducer provides both the first analog transducer signal and the second analog transducer signal.

3. The sensor as claimed in claim 1 wherein each analog transducer signal varies dependent on both the measured parameter and at least one environmental condition.

4. The sensor as claimed in claim 1 wherein the sensor includes a Hall effect transistor.

5. The sensor as claimed in claim 4 wherein the first analog transducer signal comprises a Hall voltage and the second analog transducer signal comprises a resistive voltage.

6. The sensor as claimed in claim 1 wherein the converter is an analog to digital converter.

7. The sensor as claimed in claim 1, wherein the first analog transducer signal is digitized and supplied as an input to the memory device, and the second analog transducer signal is digitized and supplied as a second input to the memory device.

8. The sensor as claimed in claim 1 wherein the memory device comprises a two dimensional look-up table with a number of rows and columns.

9. The sensor as claimed in claim 1 wherein the memory device is an erasable programmable read only memory.

10. The sensor as claimed in claim 1 wherein the memory device location value is calculated to correct the effect of non-linearities in the analog transducer signal.

11. The sensor as claimed in claim 1 wherein the memory device location values are calculated to correct the effect of at least one environmental condition on an analog transducer signal.

12. The sensor as claimed in claim 1 wherein the memory device locations are calculated to correct both non-linearities in an analog transducer signal and the effect of at least one environmental condition on said analog transducer signal.

13. The sensor as claimed in claim 1 wherein the value stored in each memory device location is calculated prior to use of the sensor.

14. The sensor as claimed in claim 1 wherein the sensor further comprises a digital to analog converter associated with the output of the memory device, said digital to analog converter being adapted to convert said digital output value into an analog output value.

15. The sensor as claimed in claim 14 wherein the sensor further comprises a summation device adapted to receive said analog output value from the digital to analog converter and to add the analog output value to an analog transducer signal.

16. The sensor as claimed in claim 15 wherein the analog output of the summation device corrects for non-linearities and/or environmental conditions in an analog transducer signal.

17. A method of operating a sensor comprising the steps of, a) providing a first analog transducer signal to a first converter from a transducer, b) providing a second analog transducer signal to a second converter, c) converting said first analog transducer signal to a first digital transducer signal, d) converting said second analog transducer signal to a second digital transducer signal, e) supplying said first and second digital transducer signals directly to two separate inputs of a memory device, f) matching a memory location in the memory device to both said first digital transducer signal and said second digital transducer signal, and g) transmitting a digital output value stored within said matched memory location.

18. The method of operating a sensor as claimed in claim 17 further comprising the additional subsequent step of supplying said analog output value to a summation device to add the analog value to an analog transducer signal.

* * * * *